United States Patent [19]

Edwards et al.

[11] Patent Number: 5,014,213
[45] Date of Patent: May 7, 1991

[54] SYSTEM FOR USE WITH POLYPHASE UTILITY METERS FOR RECORDING TIME OF ENERGY USE

[75] Inventors: Cree A. Edwards, Redwood City; Larsh M. Johnson, San Francisco, both of Calif.

[73] Assignee: Domestic Automation Company, Inc., San Carlos, Calif.

[21] Appl. No.: 183,826

[22] Filed: Apr. 20, 1988

[51] Int. Cl.$^5$ .................. G06F 15/56; G01R 1/02
[52] U.S. Cl. ..................... 364/483; 324/116; 340/870.02; 364/492
[58] Field of Search ................. 364/480-483, 364/492, 900 MS File; 324/156, 113, 157, 103 R, 114, 137, 74, 116, 142, 139; 340/870.02, 870.29, 310 A, 310 R; 250/231 SE

[56] References Cited

U.S. PATENT DOCUMENTS

| | | | |
|---|---|---|---|
| 2,132,256 | 10/1936 | Cameron | 324/116 |
| 2,139,821 | 5/1936 | Greenwood et al. | 324/116 |
| 2,246,185 | 3/1939 | Pratt | 324/103 R |
| 3,059,181 | 10/1962 | Benbow et al. | 324/103 R |
| 3,729,727 | 4/1973 | Young et al. | 340/870.02 |
| 4,050,020 | 9/1977 | Germer et al. | 324/116 |
| 4,121,147 | 10/1978 | Becker et al. | 324/157 |
| 4,179,654 | 12/1979 | Germer | 324/116 |
| 4,297,635 | 10/1981 | Stevens | 324/156 |
| 4,298,839 | 11/1981 | Johston | 340/870.02 |
| 4,335,447 | 6/1982 | Jerrim | 324/116 |
| 4,355,361 | 10/1982 | Riggs et al. | 324/103 R |
| 4,415,853 | 11/1963 | Fisher | 324/74 |
| 4,465,970 | 8/1984 | DiMassimo et al. | 324/103 R |
| 4,467,434 | 8/1984 | Hurley et al. | 364/483 |
| 4,491,789 | 1/1985 | Benbow | 324/113 |
| 4,491,791 | 1/1985 | Balch et al. | 340/870.02 |
| 4,516,213 | 5/1985 | Gidden | 340/870.02 |
| 4,542,469 | 9/1985 | Brandyberry et al. | 364/483 |
| 4,630,211 | 12/1986 | Pettis | 364/483 |
| 4,638,314 | 1/1987 | Keller | 340/870.02 |
| 4,654,588 | 3/1987 | Munday | 364/483 |
| 4,673,872 | 6/1987 | Germer et al. | 324/103 R |
| 4,692,874 | 9/1987 | Mihara | 324/116 |
| 4,697,182 | 9/1987 | Swanson | 340/310 A |
| 4,701,698 | 10/1987 | Karlsson et al. | 324/116 |
| 4,701,858 | 10/1987 | Stokes et al. | 340/870.02 |
| 4,783,623 | 11/1988 | Edwards et al. | 324/113 |
| 4,792,677 | 12/1988 | Edwards et al. | 250/231 |
| 4,803,632 | 2/1989 | Frew et al. | 340/870.02 |

*Primary Examiner*—Kevin J. Teska
*Attorney, Agent, or Firm*—Flehr, Hohbach, Test, Albritton & Herbert

[57] ABSTRACT

A system for use with polyphase electric meters having a rotatable disc for recording time of energy use. The system includes a cover, a sensor means, a first module, and a second module. The sensor means detects rotation of the meter disc. The first module is disposed within the confines of the meter cover and includes means for providing power for operation of the system. The second module is releasably mounted to the cover such that disassembly may be accomplished without the use of tools. The second module includes circuit means for determining time of energy use information and storing the same, and for optically transmitting that information to a location external of the meter.

27 Claims, 5 Drawing Sheets

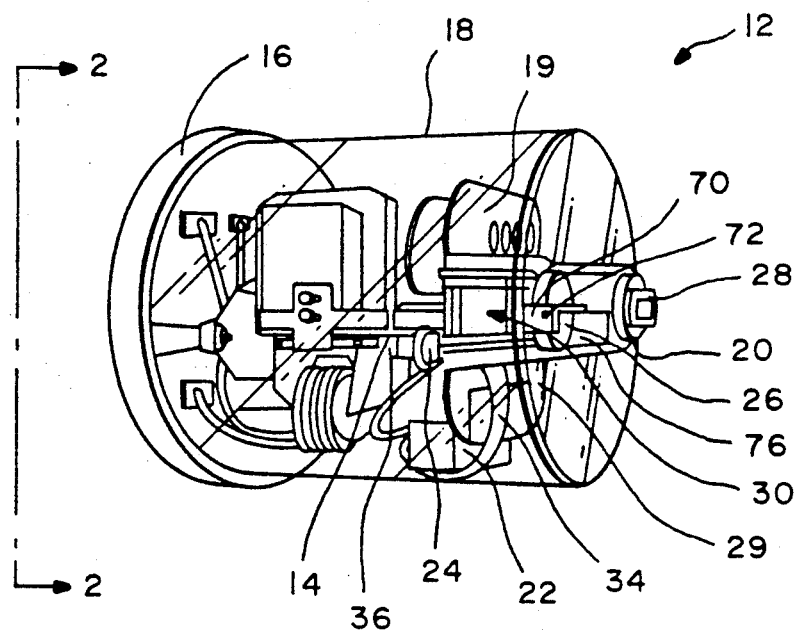
FIG.—1
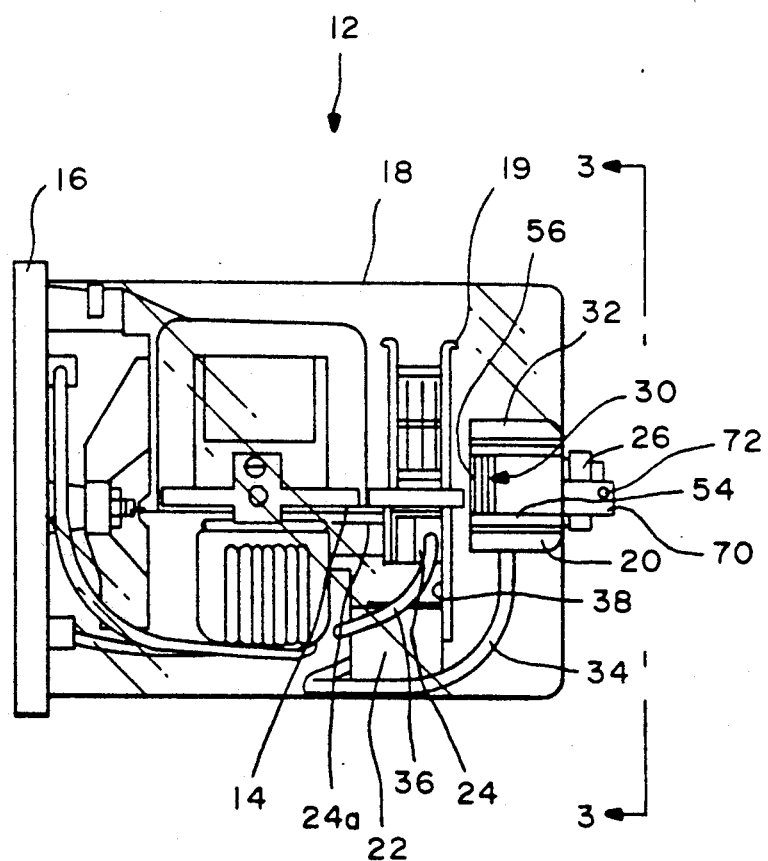
FIG.—2

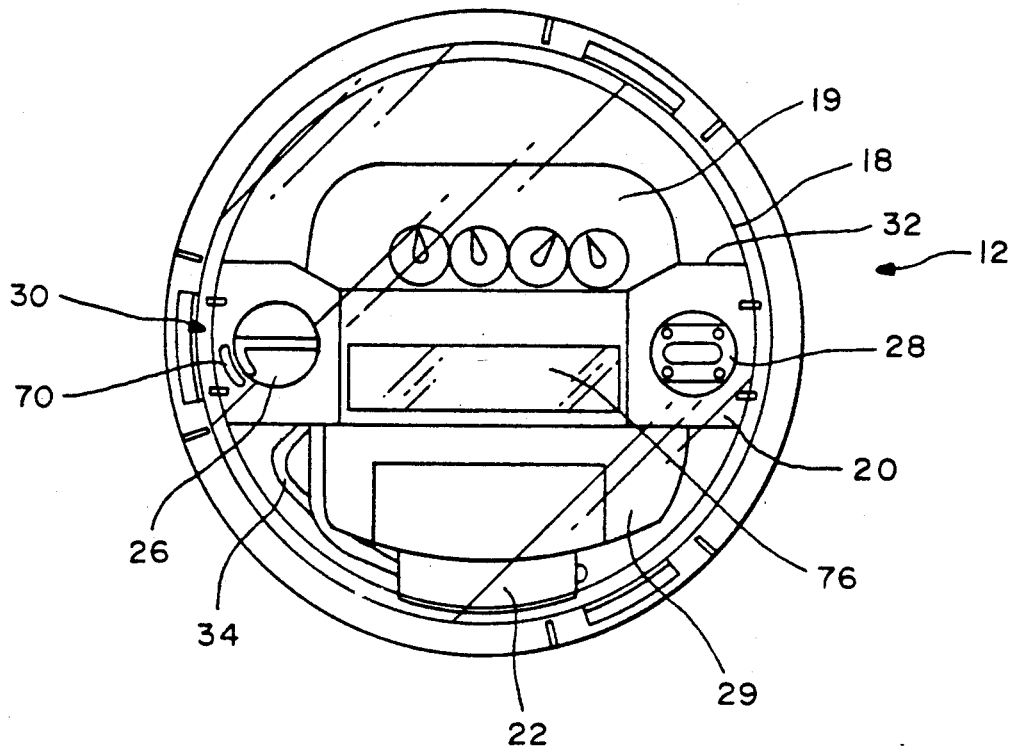
FIG.—3
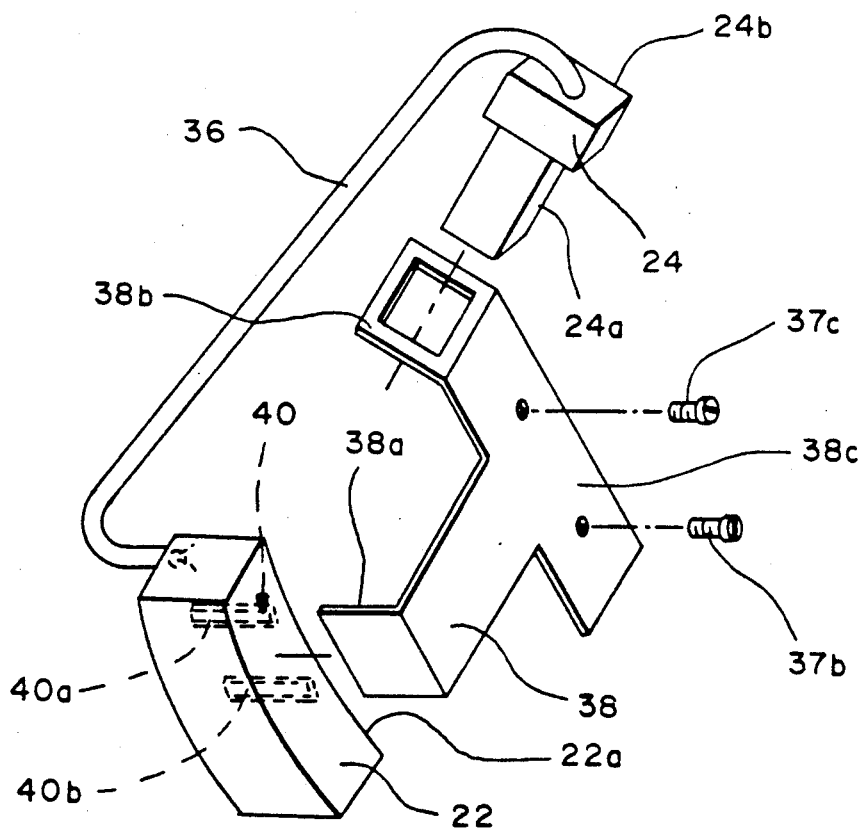
FIG.—5

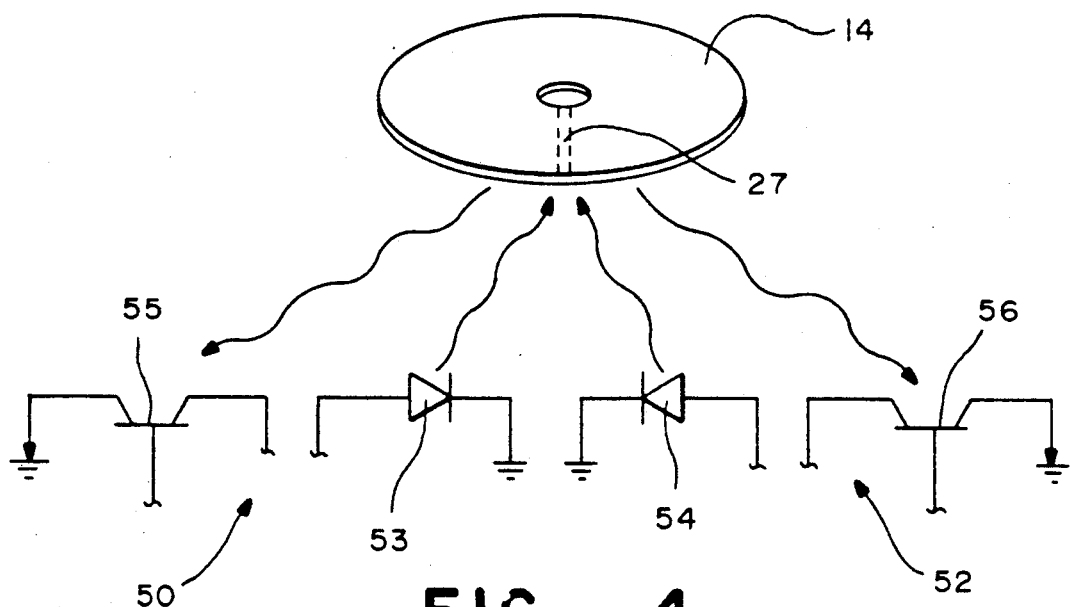
FIG.—4
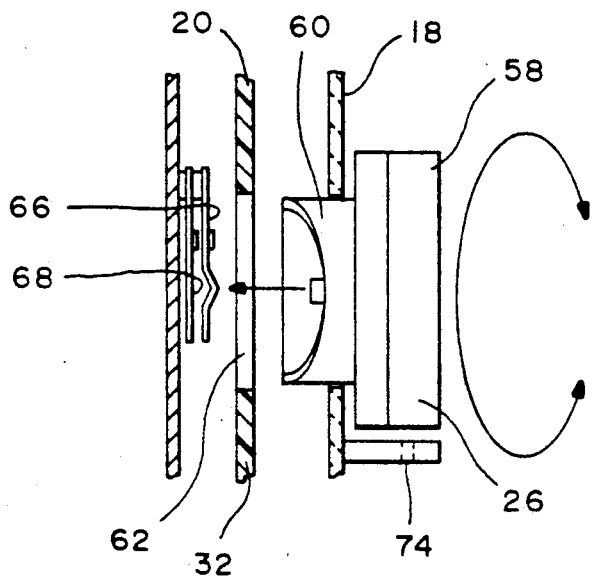
FIG.—8
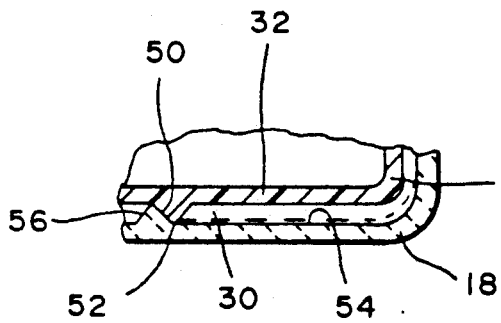
FIG.—6
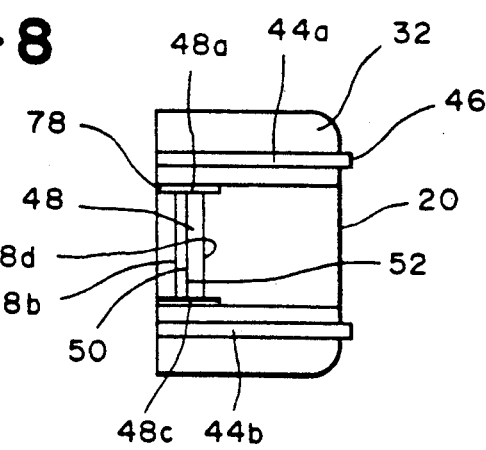
FIG.—7

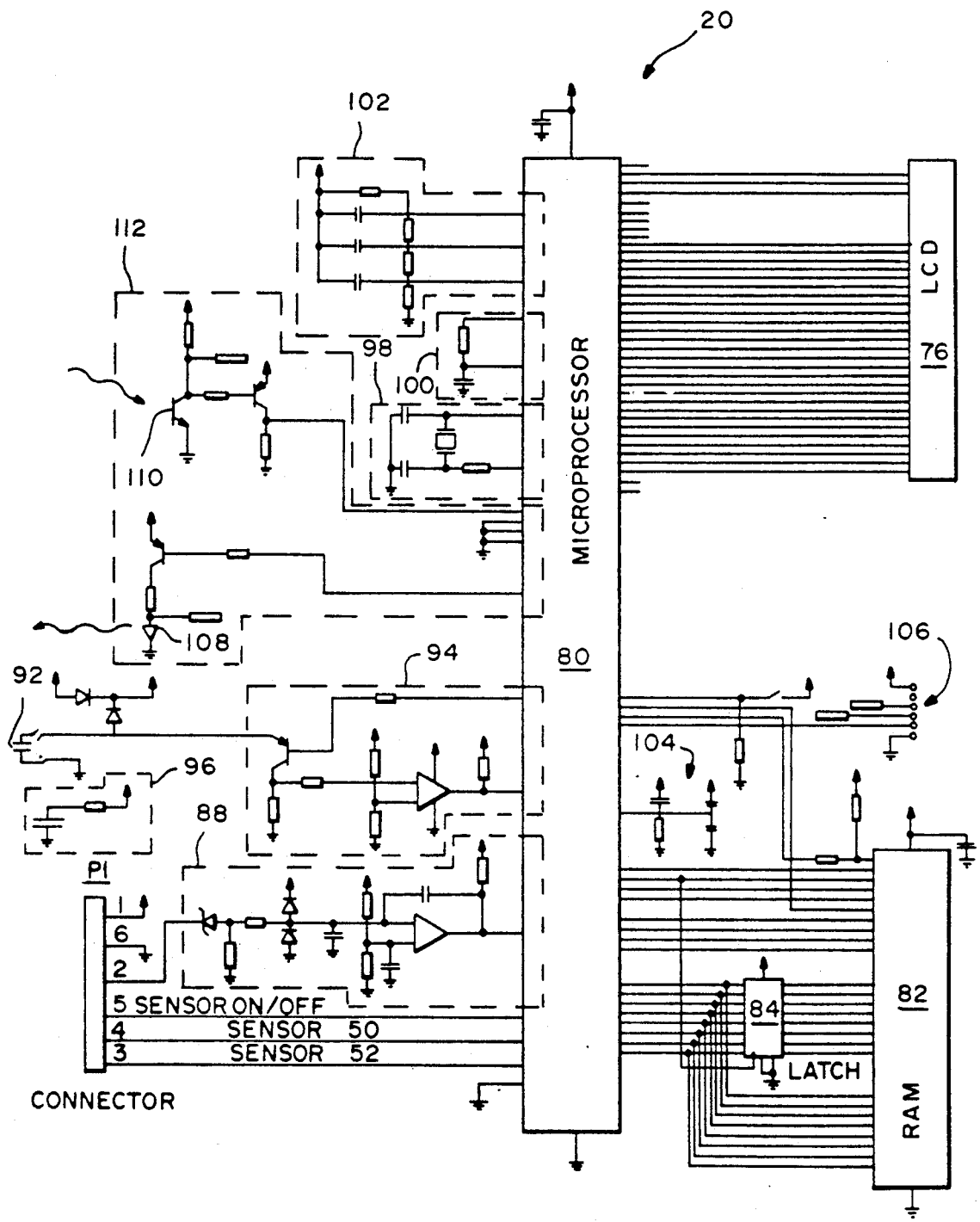
FIG.—9

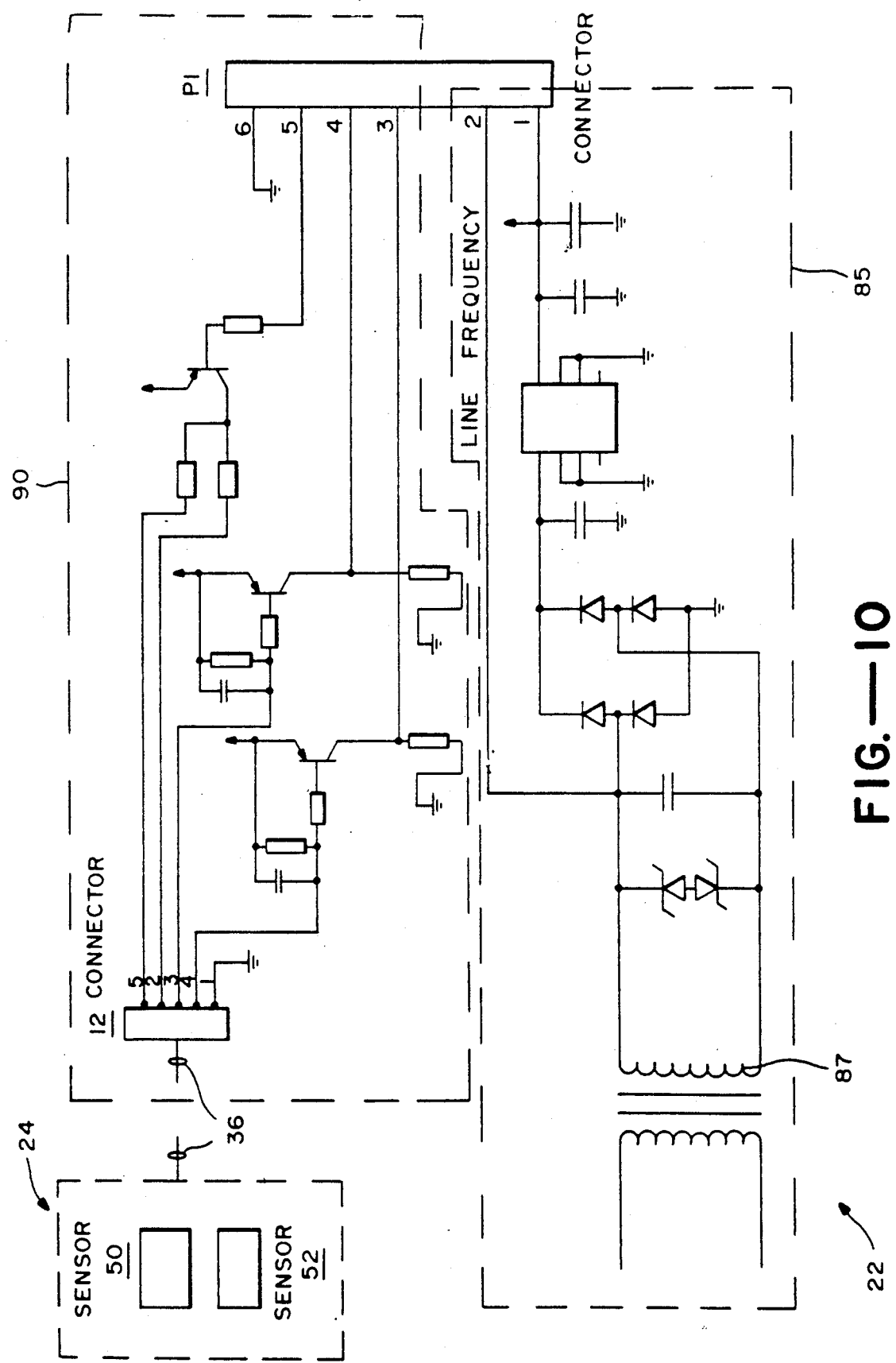
FIG.—10

SYSTEM FOR USE WITH POLYPHASE UTILITY METERS FOR RECORDING TIME OF ENERGY USE

The present invention relates generally to meters for recording energy consumption, and more particularly to a system for use with polyphase utility meters for recording time of energy use, demand and load profile data.

Electrical energy is generally sold and metered on the basis of a fixed rate schedule, for example a fixed rate per kilowatt-hour delivered. Electrical energy demand, however, varies considerably during the course of the day. Nonetheless, the fixed rate applies whether the demand for energy is high or low.

Since there are peak and slow periods occurring at different times of the day, electrical distribution and generation systems are overloaded at certain times and under-utilized at other times. This results in substantial inefficiencies as a much larger generation and distribution system than is economically desirable is required to meet the peak demands. Additionally, the low demand consumer is in effect subsidizing the high demand consumer as they are both charged the same rate for power consumption.

Various attempts have been made in the past to spread the demand for energy over greater portions of the day. For instance, clock mechanisms have been utilized for decreasing the flow of electricity during peak load periods. These systems, however, have been found to be impractical due to the necessity of frequent checking and setting of the clock switching mechanism at the various consumer locations, and due to the inability to predict peak demand load intervals and to then change the clock mechanism's timing on a relatively simple basis to track such intervals.

Multiple rate structures have also been utilized in an effort to spread the demand for energy. Consumers using electrical energy during low demand periods are charged a lower rate than consumers using energy during high demand periods. The multiple rate structure thus provides an economic incentive for consumers to use electrical energy during low demand periods, thereby leveling the load requirements placed on the generation system.

Examples of metering systems capable of registering different amounts of power consumed during different intervals of the day include a two-stage mechanical watt meter having a clock timer. Cams on the clock timer trip a mechanism which, at selected times, permit the driving of one set of meter dials or the other so that power consumption, during a selected portion of the day, could be registered by the first set of dials, while power consumed during the other portion of the day could be registered by the second set of dials. See U.S. Pat. No. 2,139,821.

Another system utilized dual rate meters wherein a clock determined which set of meters were to be activated. See U.S. Pat. Nos. 2,132,256 and 2,246,185.

Still another type of meter included three sets of decade gear driven dials for registering kilowatt hours consumed on a continuous basis, kilowatt hours consumed during mid-peak periods, and kilowatt hours consumed during high-peak periods. A programmable control circuit controlled the operation of the dials by activating the desired set at a predetermined time. The time period selection was based on time internally generated in 15 minute increments on a weekly cycle. See U.S. Pat. No. 4,050,020. Time-of-day demand meters measure and record power consumption on a demand meter register during demand intervals of predetermined lengths. The demand register is capable of being engaged at the start of a demand interval, as determined by a program in the meter, and disengaged to terminate the demand interval as determined by an interval counter. The demand intervals occur at fixed times throughout the day. See U.S. Pat. No. 4,179,654.

A variation of this type of meter provides for metering electrical energy consumption at multiple rates depending on the time of day, time of week and time of year. See U.S. Pat. No. 4,465,970.

Another example of a meter having a programmable time based measuring system is found in U.S. Pat. No. 4,465,970. The meter includes a transparent communications window for receiving and transmitting coded radiations into and from a radiation sensitive external data interface.

U.S. Pat. No. 4,415,853 discloses the use of two reflective scanners mounted on the outside of an electric meter for detecting the revolutions of the eddy current disc. A signal is emitted and amplified, and fed into a counting device. The counting device includes a memory and in conjunction with a printer prints the time of day, the date, and number of revolutions of the rotating disc. This information is stored in a memory for a given unit of time.

Excellent, highly-standardized, electromechanical meters for metering power consumption at fixed rates are currently in place at literally millions of locations throughout the United States. These meters are either single phase or polyphase meters. Residential, and small commercial and agricultural consumers typically use single phase power and account for the vast majority of meter installations. Large commercial, agricultural and industrial consumers generally utilize polyphase power and may account for the majority of a utility's revenues.

Polyphase meters measure energy consumption from multiple AC power phases. AC power is typically generated in three phases each separated by a 120° phase angle. Meters of this type monitor either two or three phases and are referred to by a "wire" designation. The meter that measures two phase power has a "three wire" description which accounts for the two phase "wires" and one return or neutral wire. Polyphase meters are generally packed a little more compactly than single phase meters in order to fit the additional voltage windings required for the additional phases. Polyphase meters have a single-rotor or disc design like single phase meters.

The most practical and inexpensive way to provide for a multiple rate structure is to provide a system for recording time of energy use that may be readily utilized with standard electric meters, either single phase or polyphase.

The assignee of the present application, Domestic Automation Company (DAC), has heretofore developed a system that may be retrofitted on single phase meters for recording time of energy use, demand and load profile data. That system is the subject of copending patent applications, both assigned to DAC, entitled "A DEVICE FOR USE WITH A UTILITY METER FOR RECORDING TIME OF ENERGY USE", application Ser. No. 902,199, filed Aug. 29, 1986, now U.S. Pat. No. 4,783,623, and "A SYSTEM FOR USE WITH A UTILITY METER FOR RECORDING TIME OF ENERGY USE", application Ser. No. 902,161, filed Aug. 29, 1986, now U.S. Pat. No. 4,792,677, and which latter application is hereby incorporated by reference.

A multiple rate metering system is also disclosed in U.S. Pat. No. 4,516,213. This system includes a first unit mounted inside the casing of the electric meter and a second unit mounted in a portable casing that can be brought in close proximity with the first unit by a meter reader. The first unit includes a phototransistor for detecting the rotation of the meter's eddy current disc. The first unit also includes a microprocessor for maintaining a clock for the time of day and a calendar for the date, and a light emitting diode and phototransistor for communicating with the second unit. The second unit also includes a microprocessor, and a light emitting diode and phototransistor for communicating with the first unit.

U.S. Pat. No. 4,491,789 discloses an electrical energy meter containing a time of day multifunction register mounted in the cover. The register measures kilowatt hours and demand as a function of time of day. The register is cover mounted to allow installation in existing meters, and communicates with an external programmer/reader probe through an optical data link tube. U.S. Pat. No. 4,673,872 discloses a modular electronic demand register that may utilize a microprocessor.

A general object of the present invention is to provide a relatively inexpensive system readily usable on standard polyphase utility meters for recording time of energy use, demand and load profile data.

Another object of the present invention is to provide a device for recording time of energy use wherein the device is configured to fit within the confines of an enclosure of a standard polyphase meter.

Yet another object of the present invention is to provide a system for recording time of energy use, demand and load profile data and for transferring that information to a reader means that may be programmed to calculate a rate for energy use.

The present invention is directed to a system for use with polyphase meters having a rotatable disc for recording energy use. The system is capable of recording time of energy use from which energy bills can be calculated based upon time of use energy rates.

The system comprises a cover, a sensor means, a first module, and a second module. The sensor means is disposed within the confines of the cover and detects rotation of the meter disc. The first module is also disposed within the cover and includes means for providing power for operation of the system. The second module is releasably mounted to the cover such that disassembly may be accomplished without the use of tools. The second module includes circuit means for determining time of energy use information and storing the same, and for optically transmitting that information to a location external of the meter.

The system of the present invention will be described in more detail hereinafter in conjunction with the drawings wherein:

FIG. 1 is a perspective view illustrating the system of the present invention mounted within a polyphase electric meter;

FIG. 2 is a schematic side view along lines 2—2 of FIG. 1;

FIG. 3 is a schematic front view along lines 3—3 of FIG. 2;

FIG. 4 schematically illustrates operation of the sensor assembly of the system of the present invention;

FIG. 5 schematically illustrates the details of the mounting bracket to which the sensor assembly and power module of the system of the present invention may be secured;

FIG. 6 is a schematic detail illustrating the manner in which the electronics module of the system of the present invention is secured to the meter cover;

FIG. 7 is a schematic, side elevation of the electronics module of the present invention removed from the meter cover;

FIG. 8 is a detail which schematically illustrates the construction and operation of the demand reset switch of the present invention;

FIG. 9 is a schematic circuit diagram for the electronics module of the system of the present invention; and FIG. 10 is a schematic circuit diagram for the power module and sensor assembly of the system of the present invention.

Referring now to the drawings, reference is first made to FIGS. 1-3. Those figures illustrate the system of the present invention mounted within an electric polyphase meter 12. The meter is a single stator watthour meter that includes an Eddy current disc or meter wheel 14 (see also FIG. 4). The disc revolves at a rate proportional to energy throughput such that each disc revolution or half revolution represents a specific quantity of metered energy consumption.

Meter 12 further includes a base 16 and a transparent cup-shaped cover 18 securable to the base. The cover provides an enclosure for the meter. It may be made of a transparent glass or impact-resistant plastic material that protects the meter from environmental conditions and that prevents unauthorized access.

The mechanical dial register 19 of meter 12 is visible through the meter cover. The dial register indicates the total number of kilowatt hours consumed, and thus provides a measure of electrical energy consumption. The watthour metering movement that is part of the meter is not shown in any detail as the construction of the movement is well known to those skilled in the art.

The major components of the system of the present invention are: an electronics module 20, a power module 22, and a sensor assembly 24.

As will be discussed in more detail below, electronics module 20 is installed in special meter cover 18 designed to hold that module. The cover 18 is configured to fit onto standard polyphase watthour meters. Most of the electronics for the system is located in the cover-mounted module 20. The system of the present invention may be retrofitted to many different meters without modifying the meters themselves.

Mounting the electronics module 20 to the meter cover also provides a convenient way to reset demand using the mechanical switch 26, also discussed in more detail below, extending through the cover 18. Optical communication with electronics module 20 is also simplified by having an optical port 28 extending through the front face of the cover. The optical components of electronics module 20 may be mounted on a printed circuit board and mate with optical port 28 by means of an optical port 49 (see FIG. 7) when the module is installed within the cover.

The electronics module may be installed without tools and is held in place by a molded snap arrangement, as indicated generally by reference number 30 (see also FIG. 6), in the cover 18 and the housing 32 (see also FIG. 7) of electronics module 20. This allows either the electronics module 20 or the cover 18 to be replaced.

Also as will be discussed in more detail below, the electronics module 20 includes the following circuit elements: the microprocessor, the memory, power line filter circuit, optical port, liquid crystal display, super capacitor backup, battery backup, and battery backup test circuit.

The power module 22 contains all the power supply and sensor drive circuits. Specifically, it includes: the power transformer, the rectifier circuit, the voltage regulator, and the sensor drive circuit.

The power module 22 is electrically connected by a cable 34 to electronics module 20 and by a cable 36 to sensor assembly 24.

As shown schematically in FIG. 4, the sensor assembly 24 may comprise two infrared sensors, represented generally by reference numerals 50, 52. The sensors are positioned next to each other in a line parallel to the face of the meter disc. The top surface 24a (see FIGS. 2 and 5) of sensor assembly 24 has an optical port (not shown) so that the sensor assembly may "see" an opaque mark 27 located on the lower surface of meter disc 14. Particularly, mark 27 crosses over one sensor, then the next sensor, as the disc 14 rotates. Each of the sensors may include an infrared light-emitting diode 53, 54 and a phototransistor 55, 56 that generate a signal in response to the passage of mark 27 on disc 14 past the optical port, or ports, in sensor assembly 24.

As shown in FIGS. 2 and 5, power module 22 and sensor assembly 24 are mounted within the meter on a bracket 38. The bracket 38 may be mounted to that part of the meter structure that carries the meter identification plate 29. The identification plate, as is well known in the art, carries information such as the meter's model number, the utility identification number, and a manufacturer's serial number.

The identification plate is mounted to the meter structure by means of threaded members such as screws 37a and 37b. The meter structure includes respective threaded openings (not illustrated) designed to receive these threaded members. In some meters, the threaded openings may be formed in mounting posts disposed more or less at opposite sides of the meter disposed more or less at opposite sides of the meter structure. The bracket 38 is also secured to the meter structure by threaded members 37a, 37b.

Installation of the power module and sensor assembly is straight forward. The meter identification plate is removed and the bracket 38, which carries the power module 22 and sensor assembly 24, is installed utilizing screws 37a, 37b. The nameplate 29 fits in front of power module bracket 38. As noted, cable 36 electrically connects power module 22 to sensor assembly 24, and cable 34 connects the electronics module 20 to power module 22. This latter cable carries the following signals to electronics modules 20: 5 volt power, ground, 60 Hz AC signal, sensor drive, and sensor output signals.

As shown in FIG. 5, the bracket 38 has a more or less T-shape. It includes an extension 38a that is configured to fit within a channel 40 formed on the top surface 22a of power module 22. This channel is formed by upwardly projecting ridges 40a and 40b by which member 38a of bracket 38 is slideably engaged.

The upper portion of bracket 38 has one side thereof 38b angled away from portion from 38c of the bracket. Portion 38b of the bracket has an opening formed therein into which sensor assembly 24 may be inserted. The opening includes appropriate means, such as a clip (not shown), for disengagingly engaging the sensor assembly to secure it to the bracket. To this end, one end 24b of sensor assembly 24 is larger in cross-sectional dimension than the remaining portion of the sensor assembly and the opening formed in portion 38c of bracket 38. The sensor assembly is inserted into the opening in bracket portion 38b with the one end 24b abutting against the surface of that bracket portion.

As noted and as illustrated in FIGS. 1–2 and 6–7, electronics module 20 is installed within meter cover 18 in such a manner that it can be disassembled without the use of tools. Specifically, each side of housing 32 of electronics module 20 includes a snap detail or arrangement 35 that permits the housing to be installed within the cover and to be disengagably engaged therein. Since the snap assembly at each side of housing 32 is substantially the same, the assembly at only one side will be described.

As best shown in FIGS. 6–7, snap assembly 35 comprises a pair of ridges or outwardly protecting surfaces 44a and 44b that extend from the back of housing 32 to its front face 46, where they wrap around a portion of the front face and terminate. The ridges 44a, 44b are located near the top and bottom surfaces 32a and 32b, respectively, of the housing. Located more or less centrally of the ridges and also formed in the side of housing 32 is a locking tab element 48. Slots 48a, 48b and 48c are formed around three sides of the tab element such that tab element 48 is attached to the side of the housing only along boundary 48d. This provides the tab element with a spring effect. The tab element includes a sloping or a ramp-like surface 50 that slopes upwardly from slot 48b and terminates at an edge 52 of tab 48. A second ramp-like surface 53 slopes away from edge 52 and down to the side or side wall of housing 32.

The meter cover 18 includes at each side thereof, for mating with respective tab elements 48, a substantially U-shaped channel 54 (see FIGS. 2 and 6). The forward edge of each channel 54 comprises a first ramp wall 56 that slopes upwardly away from meter cover 18 and a second ramp or sloping wall 57 that slopes downwardly toward the meter cover. The width of U-shaped channel 54 is slightly less than the distance between ridges 44a and 44b on the side of housing 32. The open end of the channel terminates at the front face of the meter cover.

The housing of electronics module 20 may be secured to the meter cover in the following manner. The housing is inserted inside the meter cover such that the ridges 44a and 44b engage the side walls of U-shaped channels 54. As the housing 32 is moved toward the front of cover 18, additional pressure is applied to the rear of the housing such that ramps 53 of tabs 48 engage ramp walls 56 of U-shaped channels 54. As more pressure is applied, ramps 53 move up and over ramp walls 56 and down along ramp walls 57 such that the respective projections formed by walls 50, 53 of tab elements 48 are disposed behind the respective projections formed by walls 56, 57 of channels 54.

Tab elements 48 thus enter the space defined by the sides and ramp walls of U-shaped channels 54. Due to the flexible or spring-like nature of tab elements 48, the tab elements are in effect snapped into the cover 18. The cover 18 with module 20 mounted therein may then be secured to the meter base in the conventional manner. If it is subsequently desired to remove module 20 for any reason, such as testing, the cover may be removed from the meter base, and the module simply snapped out of the cover, without the use of tools, in the reverse of the manner in which it was installed.

The energy consumption information gathered by the system of the present invention may be collected by use of a portable, electronic, meter reader (not illustrated). The meter reader may be programmed to calculate a utility usage charge using different billing rates for different times of the day, week, or year.

The meter reader may communicate with electronic module 20 by means of an infrared serial transmitter and receiver. An infrared light source and receiver means, discussed in more detail below, are located within housing 32 for communicating with the meter reader.

The information recorded and stored by the system of the present invention is transmitted to the meter reader through optical data port 28, which projects outwardly from the front face of meter cover 18. A second optical data port 49 (FIG. 7) projects outwardly from front 46 of housing 32 to be received within port 28 when module 20 is snapped into the meter cover. Infrared light is transmitted through these two ports with sufficient intensity to be received by the meter reader, which is located externally of cover 18.

The system of the present invention also includes a demand reset switch 26 that extends through the meter cover. As is known, the demand reset switch permits a billing parameter to be manually reset.

As shown in FIG. 8, switch 26 includes a knob 58 located externally of the meter cover 18 and a cam surface 60 located internally of the cover. The cam surface 60 actually extends into a circular opening 62 formed in the front surface or face 46 of housing 32. The cam surface is designed to engage a leaf spring switch 66 situated within housing 32 of electronics module 20.

The switch 66 is normally open, and when the demand reset knob 58 is rotated, cam surface 60 engages the upper contact 70 of the leaf spring switch 66, depressing it and causing it to contact the lower contact 68 of the switch. This completes an electrical circuit through the switch and causes the demand to be reset.

Adjacent to knob 58 is a projection 70 (see also FIGS. 1-3) having an aperture 72 formed therein. A corresponding aperture or opening (not shown) is formed in knob 58. A lead (not shown) including a seal may be inserted through the opening 72 and the opening in the knob to provide an indication as to whether the meter has been tampered with by actuation of the demand reset switch.

The electronics module 20 includes a liquid crystal display (LCD) 76 (FIGS. 1 and 2) in the front face of housing 32. LCD 76 provides meter information to the consumer and the utility by a direct view of the display through the meter cover. Meter information may thus be read visually.

Electronics module 20 also includes a DC battery as a backup to a primary power source. The battery may be replaced by removing the back cover 78 of housing 36 (see FIG. 7). Cover 78 snaps into the back of the housing and may be disassembled without the use of tools.

The system of the present invention is capable of recording time of energy use, peak demand for energy, and energy load profile data. It is usable with standard polyphase watthour meters.

The system is microprocessor controlled and includes a clock-calendar. In a preferred embodiment, as shown in FIG. 9, microprocessor 80 comprises a single-chip, 4K byte microcomputer type 7514 available from Nippon Electric Corporation, Mountain View, Calif. Microprocessor 80 contains a read-only-memory (ROM), a limited random-access-memory (RAM), a timer, an LCD display controller, a clock, a calendar, and input-/output ports. The ROM provides the firmware that controls operation of the microprocessor. The limited RAM, type TC5564 from Toshiba, America, Inc., Tustin, Calif. provides for the storage of data. A RAM 82 connected to microprocessor 80 via latch 84, for example a type 74-HC-373 available from Toshiba America, Inc., Tustin, Calif. provides 8K bytes of additional data storage. The RAMs store the energy use information.

Primary power for the system controlled by microprocessor 80 is provided through power supply circuit 85 of power module 22 (see FIG. 10). Power location, converting, by means of transformer 87 and rectifier circuitry, a 240 volt AC signal to a 10 volt DC signal. The power supply circuit 85 also includes a voltage regulator that provides a regulated 5 volts DC signal which is fed to the circuitry of electronics module 20 via connectors P1 and cable 34.

The frequency of the incoming AC power line is fed to a 60 Hz filter 88 (see FIG. 9), through cable 34 and connectors P1, in the electronics module 20. The filter 88 provides a 60 Hz digital signal to microprocessor 80 so that the microprocessor is clocked in synchronization with the 60 Hz incoming power. The 60 Hz signal is also utilized for power failure detection.

Microprocessor 80 includes an internal clock unit to provide timing signals for its internal operation. The time of day in hours, minutes, and seconds, the time of the week, and the time of the year may be maintained and stored in the microprocessor. As noted, the microprocessor is clocked in synchronization with the 60 Hz power supply.

Sensors 50, 52 of sensor assembly 24 are connected to microprocessor 80 through sensor circuit 90 of power module 22. The sensors are connected to circuit 90 via connector P2 and cable 36. Sensors 50, 52 produce a signal that is periodically monitored by microprocessor 80 by accumulation of a pulse count from phototransistors 55, 56 (see FIG. 4) for different predetermined time periods.

The sensor circuitry provides for intermittent operation of light emitting diodes 53, 54. The light emitting diodes are operated so that they are pulsed on for less than 1/10 millisecond at a rate synchronized with the AC power supply timing signal. The infrared light emitted by light emitting diodes 53, 54 is reflected by the rotating disc and detected by phototransistors 55, 56. The signals are amplified by the sensor circuit 90 and then are fed to microprocessor 80.

In the case of an electrical power outage, microprocessor 80 is powered by a battery 92 connected in circuit with the microprocessor and a battery test circuit 94. Circuit 94 periodically turns on the battery to test it against a reference voltage to determine whether battery replacement is needed. Battery backup is utilized when the power line voltage drops by twenty percent or more.

The system also includes a capacitor circuit 96, including a capacitor having a capacitance of 0.22 Farads, as backup power for microprocessor 80. Most power outages are of relatively short duration, only a few hours for example. During this period, the capacitor would provide power for up to about one day. This will have the effect of retaining battery life. During longer power outages, after the capacitor is drained, backup power would come from the battery. It is expected that the backup power supply may last as long as 10 years with a backup battery and for a longer period with the capacitor circuit, assuming that power down periods are of durations that do not drain the capacitor completely. During power interruption, time keeping by the microprocessor 80 is accomplished with a 32 KHz clock circuit 98. This clock circuit is also used for serial bit timing for data transmission between a meter reader and microprocessor 80.

An RC oscillator 100 is provided for microprocessor operation (system clock).

The system provides time of use, demand, and load profile metering capability. In a preferred embodiment, energy consumption, as recorded by means of sensors 50, 52, is accumulated in microprocessor 80.

The microprocessor stores time of use (TOU) information in four time of day memory locations. The information is stored as disc revolutions. A separate location is used to store TOU information for weekends and holidays. The TOU information segregated by seasons. The information includes: total kilowatt hours (Kwh) on the meter, total Kwh in each of the four TOU periods, and the total Kwh weekend and holiday energy usage. A seasonal snapshot from previous seasons is also stored.

the demand or rate of energy use is also recorded. The demand interval may be set to 1, 2, 3, 5, 10, 15, 20, 30, or 60 minutes. The demand periods correspond to TOU periods. The microprocessor also includes a demand delay or grace period programmable from 0 to 255 minutes to account for demand after a power outage. Additionally, demand may be reset on a season change date.

The following demand information may be read from the LCD 76: continuous cumulative demand for each of the four TOU periods, peak demand during each period, date and time of last demand reset, and date and time of peak demand for each period. Additional demand information that may be read by meter reader includes: time remaining in current demand period, demand over last complete interval, and all demand information for last season.

The microprocessor is programmable to accumulate load profile data for 140 days of hourly or 35 days of 15 minute data. The meter reader can read the following load profile data: load profile history, and time, date and duration of power outages.

The microprocessor is also programmed to include meter identification information —up to 16 alphanumeric characters of which nine numeric characters are LCD readable. The microprocessor is programmable to provide the following settings for different meters: time, date and Kh constant, which relates disc rotations to Kwh. The Kh constant is programmable to the following settings for different meters: 0.3, 0.6, 1.2, 1.8, 2.4, 3.6, 4.8, 7.2, 10.8, 14.4, 21.6, 28.8, 43.2, and 57.6.

The microprocessor includes a calendar for special dates such as holidays, daylight savings time and changeover dates. Up to 170 of such dates (enough for 20 years), may be programmed into the microprocessor. The following power outage information which is stored in the load profile memory may also be read: definable length of official power outages, time on battery backup (hours minutes and seconds), number and time of power outages, and reset of battery backup and power outage information.

The system may also provide a load control function. The start and end of load control periods may be independent of TOU periods. Customers may be alerted to on-or-off peak periods and a demand threshold customer alert may be provided. The polarity of load control is programmable.

As noted heretofore, visual readout for the values measured, totaled and stored in the memory of the microprocessor may be seen at visual display 76. The display may comprise 9 numerical display elements each including 7 conductive segments. An LCD biasing circuit 102 connected in circuit with microprocessor 80 provides voltage for the display.

The system further includes a reset circuit 104 for microprocessor 80, and expansion ports, represented generally by reference numeral 106. The reset circuit is activated by demand reset switch 26 in the front of the meter cover. The expansion ports may be utilized to provide a load control relay and an interface to the power line for communication to a central source through the power line.

An infrared light emitting diode 108 and phototransistor 110 are part of a circuit 112 that provides an infrared light source and reception means for communicating with the external meter reader. The diode 108 and phototransistor 110 are located within housing 32. They provide, along with the components of the meter reader, infrared serial components of the meter reader, infrared serial communication between module 20, via optical ports 28 and 49, and the meter reader.

The meter reader communicates with microprocessor 80 by means of the above-discussed optical data ports in housing 32 of electronics module 20. Data is transmitted serially in binary form between the meter reader and module 20. A standard data rate of 1200 bits per second with one start bit, eight data bits and one stop bit make this system compatible with most computer communications. As noted, a clock circuit is provided for serial bit timing for data transmission between the meter reader and microprocessor 80.

The meter reader includes an infrared serial transmitter and receiver such as a light emitting diode and phototransistor. The meter reader further includes a microprocessor, a ROM that stores the program which controls operation of the microprocessor, and a RAM or RAMs for storing the data collected from module 20. Examples of meter readers that may be utilized with the system of the present invention are a Telxon Model PTC 701 hand-held computer available from Telxon Corporation, Akron, Ohio, and a model NTO 121XL available from Norand Data Systems, Cedar Rapids, Iowa.

As is known to those in this art, the meter reader includes a flexible cable that terminates in a head that is securable to port 28 in cover 18 so that the information stored in module 20 may be read by the meter reader.

The meter reader would provide an appropriate infrared signal, such as by means of its microprocessor and light emitting diode, received by phototransistor 110 that instructs microprocessor 80 to begin transmitting the energy use information data stored in its RAMs. The data is transmitted via light emitting diode 108, optical ports 28 and 49, the meter reader head, and the phototransistor of the meter reader. A meter location signal is also stored in microprocessor 80 and transferred to the meter reader where it is stored along with the energy use information.

The meter reader reads the usage information and formats the data into a rate structure. The meter reader may be programmed to calculate rate or usage charges utilizing different billing rates for different times of the day or week. Thus, the rate structure may be easily and economically changed by modifying the meter readers, which may only total a few hundred, as opposed to modifying the logic of module 20, which may be installed at literally millions of locations.

The energy use information collected by the meter reader may be transferred from the meter reader to a central computer where the rate charge is calculated.

The count relating to the usage information is generally not reset. This enables subsequent verification if there is a question regarding a bill.

Although certain embodiments of the invention have been described herein in detail, the invention is not to be limited only to such embodiments, but rather only by the appended claims.

What is claimed is:

1. A system for recording time of energy use for use with a polyphase electric meter having a rotatable disc, the system comprising:
    a substantially optically transparent cup-shaped cover removably securable to a base of the meter to provide an enclosure for the meter;
    sensor means disposed within the confines of said cover and positioned for detecting rotation of the disc and generating a signal in response thereto;
    a first module disposed within the confines of said cover and secured to the structure of the meter and electrically connected to said sensor means, said first module including means for providing power for operation of the system; and
    a second module releasably mounted to said cover such that disassembly from said cover can be accomplished without the use of tools, said second module including circuit means for determining time of energy use information and storing the same, and for optically transmitting said time of energy use information to a location external of said meter.

2. The system of claim 1 wherein said circuit means includes a microprocessor, a read-only memory for storing a program to control the operation of the microprocessor, and a random-access memory for storing said time of energy use information.

3. The system of claim 1 further including a display means on a front face of said second module and visible through the cover for displaying time of energy use information.

4. The system of claim 1 wherein said second module has a rear panel that is removable without the use of tools for replacement of a backup power supply.

5. The system of claim 1 wherein said sensor means comprises first and second light emitting diodes for directing light toward the disc, and first and second phototransistors for receiving light reflected from the disc and responsive to a change in the reflective index of the disc.

6. The system of claim 1 wherein said first module further includes means for driving said sensor means and amplifying signals therefrom.

7. The system of claim 1 wherein said circuit means includes a microprocessor and means for deriving clock pulses from a main power supply so that said microprocessor is clocked in synchronization with the main power supply.

8. The system of claim 7 wherein said circuit means includes means for providing clock pulses to said microprocessor should power from the main power supply drop below a predetermined value.

9. The system of claim 1 wherein said circuit means further includes a backup source of power for operation of said circuit means should the power supplied by said first module drop below a predetermined value.

10. The system of claim 9 wherein said backup source of power includes a capacitor circuit.

11. The system of claim 1 wherein said sensor means and said first module are mounted on a bracket releasably secured to the meter structure.

12. The system of claim 11 further including means for providing attachment and removal of said first module from said bracket without the use of tools.

13. The system of claim 1 further including a demand reset switch extending through the front face of said cover, the rear of said switch having a cam surface that extends into an opening formed in the front of said second module to operatively engage a normally open switch means such that when said demand reset switch is operated it causes said switch means to close.

14. The system of claim 13 wherein said switch means is a leaf spring switch.

15. The system of claim 1 wherein said second module and said cover include an optical data port for establishing optical communication with a reader means positionable externally of the cover for optically communicating with said circuit means to collect said time of energy use information for calculation of a rate charge for energy use based thereon, said optical data port in said cover projecting outwardly from the front face thereof.

16. The system of claim 15 wherein said reader means is programmed for different rate structures in calculating the rate charge.

17. The system of claim 15 wherein said circuit means includes a light emitting diode and a phototransistor for infrared serial communication of data through said optical data port.

18. The system of claim 17 wherein said reader means includes a light emitting diode and a phototransistor for said infrared serial communication of data.

19. The system of claim 1 wherein said cover and second module include means for releasably mounting said second module to said cover so that said second module may be secured and removed from said cover without the use of tools.

20. The system of claim 19 wherein said means on said cover comprises a substantially U-shaped channel located at opposite sides of said cover and each of said channels having a sloping forward edge.

21. The system of claim 20 wherein said means on said second module includes a tab element formed at opposite sides of said second module for releasably engaging respective ones of said U-shaped channels.

22. The system of claim 21 wherein each of said tab elements include a ramp for engaging said sloping forward edge of said U-shaped channel.

23. A system for recording time of energy use for use with a polyphase electric meter having a rotatable disc, the system comprising:
    sensor means disposed within the confines of said meter and positioned for detecting rotation of the disc and generating a signal in response thereto;
    a first module disposed within the confines of said meter and secured to the structure of the meter and electrically connected to said sensor means, said first module including means for providing power for operation of the system; and a second module releasably mounted to a substantially optically transparent cup-shaped cover removably securable to a base of the meter to provide an enclosure such that disassembly of said second module from said cover can be accomplished without the use of tools, said second module including circuit means for determining time of energy use information and storing the same, and for optically transmitting said time of energy use information to a location external of said meter.

24. An apparatus for recording time of energy use for use with a polyphase electric meter, the apparatus comprising:

a substantially optically transparent cup-shaped cover removably securable to a base of the meter;

a module releasably mountable to said cover, said module including circuit means for determining time of energy use information and storing the same, and for optically transmitting said information to a location external of said cover; and means on said cover and said module for releaseably mounting said module to said cover so that said module is securable and removable from said cover without the use of tools.

25. The apparatus of claim 24 wherein said means on said cover comprises a substantially U-shaped channel located at opposite sides of said cover and each of said channels having a sloping forward edge.

26. The apparatus of claim 25 wherein said means on said module includes a moveable tab element formed at opposite sides of said module for releaseably engaging respective ones of said U-shaped channels.

27. The apparatus of claim 26 wherein each of said tab elements includes a ramp for engaging said sloping forward edge of said U-shaped channels.

* * * * *